United States Patent
Sun et al.

(10) Patent No.: US 12,150,366 B2
(45) Date of Patent: Nov. 19, 2024

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Kaipeng Sun, Beijing (CN); Yue Long, Beijing (CN); Jianchang Cai, Beijing (CN); Weiyun Huang, Beijing (CN); Qiwei Wang, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 17/429,171

(22) PCT Filed: Oct. 27, 2020

(86) PCT No.: PCT/CN2020/124140
§ 371 (c)(1),
(2) Date: Aug. 6, 2021

(87) PCT Pub. No.: WO2022/087848
PCT Pub. Date: May 5, 2022

(65) Prior Publication Data
US 2022/0310717 A1 Sep. 29, 2022

(51) Int. Cl.
*H10K 59/35* (2023.01)
*H10K 59/65* (2023.01)

(52) U.S. Cl.
CPC .......... *H10K 59/65* (2023.02); *H10K 59/352* (2023.02); *H10K 59/353* (2023.02)

(58) Field of Classification Search
CPC ..................... H10K 59/351–353; H10K 59/65
See application file for complete search history.

(56) References Cited

U.S. PATENT DOCUMENTS

| 10,217,802 B2 | 2/2019 | Hwang |
| 10,707,281 B2 | 7/2020 | Kuo et al. |
| (Continued) | | |

FOREIGN PATENT DOCUMENTS

| CN | 107452773 A | 12/2017 |
| CN | 109742116 A | 5/2019 |
| (Continued) | | |

OTHER PUBLICATIONS

Written Opinion for International Application No. PCT/CN2020/124140 mailed Aug. 2, 2021.

*Primary Examiner* — Eric K Ashbahian
(74) *Attorney, Agent, or Firm* — Perilla Knox & Hildebrandt LLP; Kenneth A. Knox

(57) ABSTRACT

The present disclosure relates to a display panel and a display device. The display panel includes a base substrate with a display area and a non-display area surrounding the display area, the display area including a first display sub-area and a second display sub-area; a plurality of first light emitting elements formed on the base substrate and located in the first display sub-area; and a plurality of first pixel circuits formed on the base substrate and located in at least one of the second display sub-area and the non-display area, where the first pixel circuits are electrically connected to the first pixel electrodes of the first light emitting elements through a conductive wire.

18 Claims, 10 Drawing Sheets

(56) References Cited

U.S. PATENT DOCUMENTS

| | | | |
|---|---|---|---|
| 2017/0345877 A1 | 11/2017 | Hwang | |
| 2019/0296096 A1* | 9/2019 | Tian | G09G 3/3208 |
| 2020/0052048 A1* | 2/2020 | Kuo | G06F 1/1605 |
| 2020/0279895 A1 | 9/2020 | Kuo et al. | |
| 2021/0202608 A1* | 7/2021 | Lee | H10K 59/131 |
| 2021/0399060 A1* | 12/2021 | Seo | H10K 59/121 |
| 2022/0069037 A1* | 3/2022 | Kim | H10K 59/122 |
| 2023/0082133 A1* | 3/2023 | Sun | H10K 59/353 |
| | | | 257/89 |
| 2023/0132145 A1* | 4/2023 | Sun | H10K 59/353 |
| | | | 257/40 |

FOREIGN PATENT DOCUMENTS

| | | |
|---|---|---|
| CN | 110278300 A | 9/2019 |
| CN | 110767711 A | 2/2020 |
| CN | 110807994 A | 2/2020 |
| CN | 111028765 A | 4/2020 |
| CN | 111046599 A | 4/2020 |
| CN | 111129100 A | 5/2020 |
| CN | 111129102 A | 5/2020 |
| CN | 111341936 A | 6/2020 |
| CN | 111477103 A | 7/2020 |
| CN | 111627341 A | 9/2020 |
| JP | 2015206873 A | 11/2015 |

\* cited by examiner

DISPLAY PANEL AND DISPLAY DEVICE

CROSS-REFERENCE TO RELATED APPLICATION

The present application is a 35 U.S.C. § 371 national phase application of International Application No. PCT/CN2020/124140 filed on Oct. 27, 2020, the entire disclosure of which is incorporated herein as a part of the present application for all purposes.

TECHNICAL FIELD

The present disclosure relates to the field of display technology and, in particular, to a display panel and a display device.

BACKGROUND

Cameras are usually installed on existing display devices to meet shooting needs. In order to maximize the screen-to-body ratio, technologies such as notch screen, water drop screen, and hole digging in screen have appeared successively. These technologies reduce the area occupied by the camera in the peripheral area by digging a hole in a part of the display area and placing a camera below the digging area, thereby increasing the screen-to-body ratio. However, the above technique needs to dig out part of the display area, which will cause some areas of the display screen to fail to display.

In order to avoid sacrificing the display area, one way is to set a light transmitting display area on the display panel, and set an under-screen camera below the position corresponding to the light transmitting display area, so that the area can be used for the functions of both camera and display, which improves users experience. However, the current problem with regard to this type of display panel is that there is strong diffraction interference in the light transmitting display area, and the image quality of the camera is poor.

It should be noted that the information disclosed in the background art section above is only used to enhance the understanding of the background of the present disclosure, and therefore may include information that does not constitute the prior art known to those of ordinary skill in the art.

BRIEF SUMMARY

In an aspect of the present disclosure, a display panel includes:
  a base substrate, having a display area and a non-display area surrounding the display area, the display area including a first display sub-area and a second display sub-area;
  a plurality of first light emitting elements, formed on the base substrate and located in the first display sub-area, wherein each of the first light emitting elements includes a first pixel electrode, a gap exists between adjacent first pixel electrodes, and the gaps around the first pixel electrodes in at least two first light emitting elements with the same light emitting color have different patterns; and
  a plurality of first pixel circuits, formed on the base substrate and located in at least one of the second display sub-area and the non-display area, wherein the first pixel circuits are electrically connected to the first pixel electrodes via a conductive wire.

In an exemplary embodiment of the present disclosure, the display panel further includes:
  a plurality of second light emitting elements formed on the base substrate, and located in the second display sub-area, wherein each of the second light emitting elements includes a second pixel electrode, a gap exists between adjacent second pixel electrodes, and the gaps around at least a part of the second pixel electrodes have the same pattern; and
  a plurality of second pixel circuits, formed on the base substrate and located in the second display sub-area, wherein the second pixel circuits are electrically connected to the second pixel electrodes, and an orthographic projection on the base substrate of the second pixel circuits at least partially overlaps with an orthographic projection on the base substrate of the second light emitting elements electrically connected thereto.

In an exemplary embodiment of the present disclosure, the display panel further includes a pixel definition layer formed on the base substrate and located in the first display sub-area and the second display sub-area. The pixel definition layer has a plurality of first pixel openings located in the first display sub-area and a plurality of second pixel openings located in the second display sub-area.

The first pixel electrode includes a first main electrode portion and a first connection portion that are arranged in the same layer and connected to each other, and at least a part of the first connection portion is electrically connected to the conductive wire through a first via structure located in the first display sub-area.

The second pixel electrode includes a second main electrode portion and a second connection portion that are arranged in the same layer and connected to each other, and the second connection portion is electrically connected to the second pixel circuits through a second via structure located in the second display sub-area.

The orthographic projection on the base substrate of each of the first pixel openings is located within an orthographic projection on the base substrate of the respective first main electrode portion, and the orthographic projection on the base substrate of each of the second pixel openings is located within an orthographic projection on the base substrate of the respective second main electrode portion.

In an exemplary embodiment of the present disclosure, the gaps around the first pixel electrodes have different patterns.

In an exemplary embodiment of the present disclosure, the first main electrode portions have different patterns.

In an exemplary embodiment of the present disclosure, the first main electrode portions have different areas.

In an exemplary embodiment of the present disclosure, the shape of the first main electrode portion in each of the first light emitting elements is the same as the shape of the first pixel opening corresponding thereto.

The shape of the second main electrode portion in each of the second light emitting elements is the same as the shape of the second pixel opening corresponding thereto, and the second main electrode portions of the second pixel electrodes in the second light emitting elements with the same light emitting color have the same patterns.

Some of the first light emitting elements and some of the second light emitting elements have the same light emitting color, wherein, in the first light emitting element and the second light emitting element having the same light emitting color, the shape of the first main electrode portion of the first light emitting element and the shape of the second main electrode portion of the second light emitting element are the same, and the ratio of the area of the first main electrode portion of the first light emitting element to the area of the second main electrode portion of the second light emitting element is from 0.9 to 1.1.

In an exemplary embodiment of the present disclosure, the shape of the first main electrode portion is different from the shape of the first pixel opening corresponding thereto.

In an exemplary embodiment of the present disclosure, the shape of the first pixel opening is a polygon, and the shape of the first main electrode portion is an ellipse or a circle.

In an exemplary embodiment of the present disclosure, in each row, the center of the first pixel electrode of at least one of the first light emitting elements with the same emitting color is not located on the first straight line, wherein the first straight line is parallel to the row direction.

In each column, the gaps in the column direction between the first pixel electrodes of any two of the first light emitting elements with the same light emitting color are different.

In an exemplary embodiment of the present disclosure, the plurality of first light emitting elements includes a plurality of red light emitting elements, a plurality of blue light emitting elements, and a plurality of green light emitting elements, wherein the number of the red light emitting elements is equal to the number of the blue light emitting elements, and the number of the green light emitting elements is twice the number of the red light emitting elements.

In each row, the center of the first pixel electrode of at least one of the plurality of red light emitting elements is not located on the first straight line, the center of the first pixel electrode of at least one of the plurality of blue light emitting elements is not located on the first straight line, and the centers of the first pixel electrodes of the plurality of green light emitting elements are all located on the first straight line.

In each column, the gaps in the column direction between the first pixel electrodes of any two of the plurality of red light emitting elements are different, the gaps in the column direction between the first pixel electrodes of any two of the plurality of blue light emitting elements are different, and the gaps in the column direction between the first pixel electrodes of two adjacent ones of the plurality of green light emitting elements are the same.

In an exemplary embodiment of the present disclosure, in each row, the gaps in the row direction between the first pixel electrodes of two adjacent ones of the plurality of red light emitting elements are the same; and in each column, the centers of the first pixel electrodes of the plurality of red light emitting elements are all located on the second straight line.

In each row, the gaps in the row direction between the first pixel electrodes of two adjacent ones of the plurality of blue light emitting elements are the same; and in each column, the centers of the first pixel electrodes of the plurality of blue light emitting elements are all located on the second straight line.

In each row, the gaps in the row direction between the first pixel electrodes of two adjacent ones of the plurality of green light emitting elements are the same; and in each column, the centers of the first pixel electrodes of the plurality of green light emitting elements are all located on the second straight line.

Specifically, the second straight line is parallel to the column direction.

In an exemplary embodiment of the present disclosure, the center of the orthographic projection on the base substrate of each of the first main electrode portions coincides with the center of the orthographic projection on the base substrate of the corresponding first pixel opening.

The center of the orthographic projection on the base substrate of each of the second main electrode portions coincides with the center of the orthographic projection on the base substrate of the corresponding second pixel opening.

In an exemplary embodiment of the present disclosure, the gap between the contour line of each of the first main electrode portions and the contour line of the first pixel opening corresponding thereto is from 1 μm to 5 μm. The gap between the contour line of each of the second main electrode portions and the contour line of the second pixel opening corresponding thereto is from 1 μm to 5 μm.

In an exemplary embodiment of the present disclosure, the first connection portions of at least two of the first light emitting elements with the same light emitting color have different length directions.

In an exemplary embodiment of the present disclosure, the gap between the first main electrode portion and the first via structure connected thereto through the first connection portion is the first gap, and the first gaps in at least two of the first light emitting elements with the same light emitting color are different.

In an exemplary embodiment of the present disclosure, the value of the first gap is from 0 to 10 μm.

In an exemplary embodiment of the present disclosure, each of the first pixel circuits is electrically connected to the first pixel electrode of a respective one of the first light emitting elements through a conductive wire.

Each of the second pixel circuits is electrically connected to the first pixel electrode of a respective one of the second light emitting elements.

In an exemplary embodiment of the present disclosure, the conductive wire is located on a side of the first pixel electrode close to the base substrate.

In an exemplary embodiment of the present disclosure, materials of the first pixel electrode and the conductive wire include indium zinc oxide or indium tin oxide.

Another aspect of the present disclosure provides a display device, which includes the display panel described in any one of the above embodiments and a photosensitive sensor arranged on the backlight side of the display panel, wherein the orthographic projection on the base substrate of the photosensitive sensor is located in the first display sub-area.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
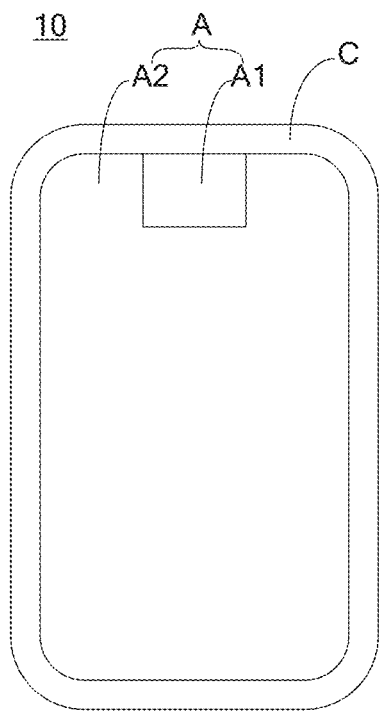
FIG. 1 shows a schematic structural diagram of a base substrate according to an embodiment of the present disclosure.

In order to make the objectives, technical solutions, and advantages of the present disclosure clearer, embodiments of the present disclosure will be described in detail below with reference to the accompanying drawings. Note that the embodiments can be implemented in a number of different forms. A person of ordinary skill in the technical field can easily understand the fact that the method and content can be transformed into various forms without departing from the purpose and scope of the present disclosure. Therefore, the present disclosure should not be interpreted as being limited to the content described in the following embodiments. In the case of no conflict, the embodiments in the present disclosure and the features in the embodiments can be combined with each other arbitrarily.

With the development of display technology, the existing design of notch screen or water drop screen gradually cannot meet the user's demand for a high screen-to-body ratio of the display panel, and thus a series of display panels with light transmitting display areas have emerged as the times require. In this type of display panel, hardware such as photosensitive sensors (such as a camera) can be installed in the light transmitting display area. Because there is no need to punch holes, a true full screen is possible under the premise of ensuring the practicability of the display panel.

Embodiments of the present disclosure provide a display panel, which can reduce the diffraction interference of the light transmitting display area on the premise that the light emitting elements in the light transmitting display area are reliably driven and the light transmittance of the light transmitting display area is relatively good. Thus, the image quality of the product can be improved.

The reference numerals used in the figures is as follows: 1. display panel; 10, base substrate; 11. first light emitting element; 110, first pixel electrode; 1101, first main electrode portion; 1102, first connection portion; 111, first organic light emitting layer; 112, first common electrode; 12, first pixel circuit; 13, conductive wire; 130, first conductive wire; 131, second conductive wire; 132, third conductive wire; 14, second light emitting element; 140, second pixel electrode; 1401, second main electrode portion; 1402, second connection portion; 141, second organic light emitting layer; 142, second common electrode; 15, second pixel circuit; 16, pixel definition layer; 160, first pixel opening; 161, second pixel opening; 17, insulating stack; 180, first transfer electrode; 181, second transfer electrode; 2. photosensitive sensor; and 3. integrated circuit.

Figure 2:
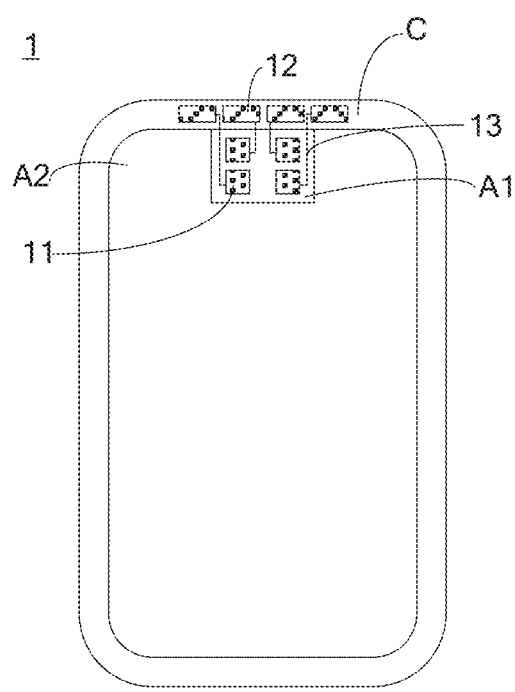
FIG. 2 shows a schematic structural diagram of a display panel according to an embodiment of the present disclosure.

As shown in FIGS. 1 and 2, the display panel 1 may include a base substrate 10, a plurality of first light emitting elements 11, and a plurality of first pixel circuits 12.

As shown in FIG. 1, the base substrate 10 may have a display area A and a non-display area C surrounding the display area A. The display area A may include a first display sub-area A1 and a second display sub-area A2. The second display sub-area A2 may at least partially surround the first display sub-area A1. For example, the first display sub-area A1 shown in FIG. 1 is located at the top middle position of the display area A of the base substrate 10, and the top side of the first display sub-area A1 is contiguous to the non-display area C. The second display sub-area A2 surrounds the remaining three sides of the rectangular first display sub-area A1 except for the top side.

It should be noted that the first display sub-area A1 may not be located at the top middle position of the display area A, or may be located at other positions. For example, the first display sub-area A1 may be located at the upper left corner, the upper right corner, or the middle position of the display area A. That is, the second display sub-area A2 is not limited to surrounding the remaining three sides of the rectangular first display sub-area A1 except for the top side, and may also surround two sides or four sides of the rectangular first display sub-area A1. In addition, the shape of the first display sub-area A1 is not limited to the rectangle shown in FIG. 1, but may also be a circle, an ellipse, etc., depending on the specific situations.

With reference to FIGS. 1 and 2, a plurality of first light emitting elements 11 are formed on the base substrate 10 and located in the first display sub-area A1, and a plurality of first pixel circuits 12 are formed on the base substrate 10 and located in the non-display area C. But the present disclosure is not limited to this, and the plurality of first pixel circuits 12 may also be located in the second display sub-area A2. Alternatively, a part of the plurality of first pixel circuits 12 is located in the non-display area C, and the other part is located in the second display sub-area A2.

The first pixel circuits 12 can be electrically connected to the first light emitting elements 11 through the conductive wire 13, so as to provide a driving signal for the connected first light emitting elements 11 to drive the first light emitting elements 11 to emit light. For example, the number of the first pixel circuits 12 can be equal to the number of the first light emitting elements 11, and each first pixel circuit 12 can be electrically connected to a respective first light emitting element 11 through a conductive wire 13. But the present disclosure is not limited to this, and the number of the first pixel circuits 12 may not be equal to the number of the first light emitting elements 11. For example, a plurality of first pixel circuits 12 are electrically connected to a single first light emitting element 11, or a single first pixel circuit 12 is electrically connected to a plurality of first light emitting elements 11.

It should be noted that when the plurality of first pixel circuits 12 are located in the non-display area C, they need to be located in an area of the non-display area C close to the first display sub-area A1. For example, as shown in FIG. 2, the first display sub-area A1 is located at the top center of the display area A. At this time, the area where the plurality of first pixel circuits 12 is located is positioned at the top center of the non-display area C.

Based on the foregoing, the first pixel circuits 12 and the first light emitting elements 11 are located in different areas of the base substrate 10. Therefore, there is no overlap between the orthographic projection of the first pixel circuits 12 on the base substrate 10 and the orthographic projection of the first light emitting elements 11 on the base substrate.

Figure 3:
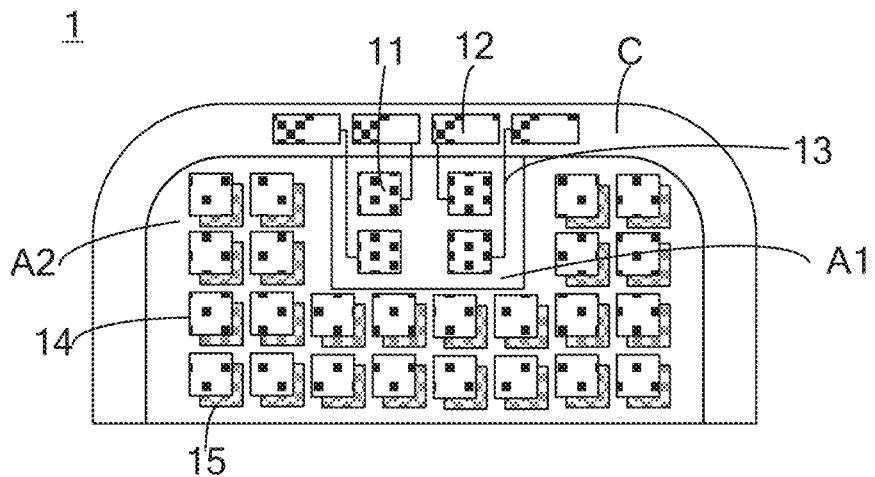
FIG. 3 shows a schematic diagram of a partial structure of a display panel according to another embodiment of the present disclosure.

With reference to FIG. 2 and FIG. 3, the display panel 1 according to an embodiment of the present disclosure may further include a plurality of second light emitting elements 14 and a plurality of second pixel circuits 15. The plurality of second light emitting elements 14 are formed on the base substrate 10 and are located in the second display sub-area A2. The plurality of second pixel circuits 15 are formed on the base substrate 10 and are also located in the second display sub-area A2. The second pixel circuits 15 can be electrically connected to the second light emitting elements 14, so as to provide a driving signal for the connected second light emitting elements 14 to drive the second light emitting elements 14 to emit light. For example, the number of the second pixel circuits 15 and the number of the second light emitting elements 14 may be equal, and each second pixel circuit 15 may be electrically connected to a respective second light emitting element 14, but it is not limited to this. The number of the second pixel circuits 15 may also be different from the number of the second light emitting elements 14. For example, multiple second pixel circuits 15 are electrically connected to a single second light emitting element 14, or a single second pixel circuit 15 is electrically connected to multiple second light emitting elements. 14.

Taking each second pixel circuit 15 being electrically connected to a respective second light emitting element 14 as an example, according to an embodiment of the present disclosure, the orthographic projection on the base substrate 10 of the second pixel circuits 15 can at least partially overlap with the orthographic projection on the base substrate 10 of the second light emitting elements 14 electrically connected thereto, as shown in FIG. 3.

It should be noted that the first light emitting elements 11 and the second light emitting elements 14 mentioned in embodiments of the present disclosure are transparent structures, and the first pixel circuits 12 and the second pixel circuits 15 are non-transparent structures.

Based on the aforementioned structures, in an embodiment of the present disclosure, the second display sub-area A2 can be set as a non-transmissive display area, and the first display sub-area A1 can be set as a translucent display area. That is, the second display sub-area A2 described in embodiments of the present disclosure is not light-transmissive, and the first display sub-area A1 is light-transmissive. In this way, there is no need to drill holes on the display panel 1, and the required hardware structures such as the photosensitive sensor can be directly arranged in the first display sub-area A1, which lays a solid foundation for the realization of a full screen. In addition, since only the first light emitting elements 11 are included in the first display sub-area A1, and no pixel circuit is included, it can be also ensured that the light transmittance of the first display sub-area A1 is better.

It should be noted that since the conductive wire 13 needs to electrically connect the first light emitting elements 11 located in the first display sub-area A1 with the first pixel circuits 12 located in other areas (i.e., the non-display area C), as shown in FIG. 2 and FIG. 3, at least part of the conductive wire 13 needs to be located in the first display sub-area A1. In order to increase the light transmittance of the first display sub-area A1, the conductive wire 13 may be a transparent structure. For example, the conductive wire 13 can be made of conductive materials such as indium tin oxide (ITO) or indium zinc oxide (IZO), so as to ensure its conductivity while increasing its light transmittance. But it is not limited to this, and the conductive wire 13 can also be made of other conductive materials.

Figure 4:
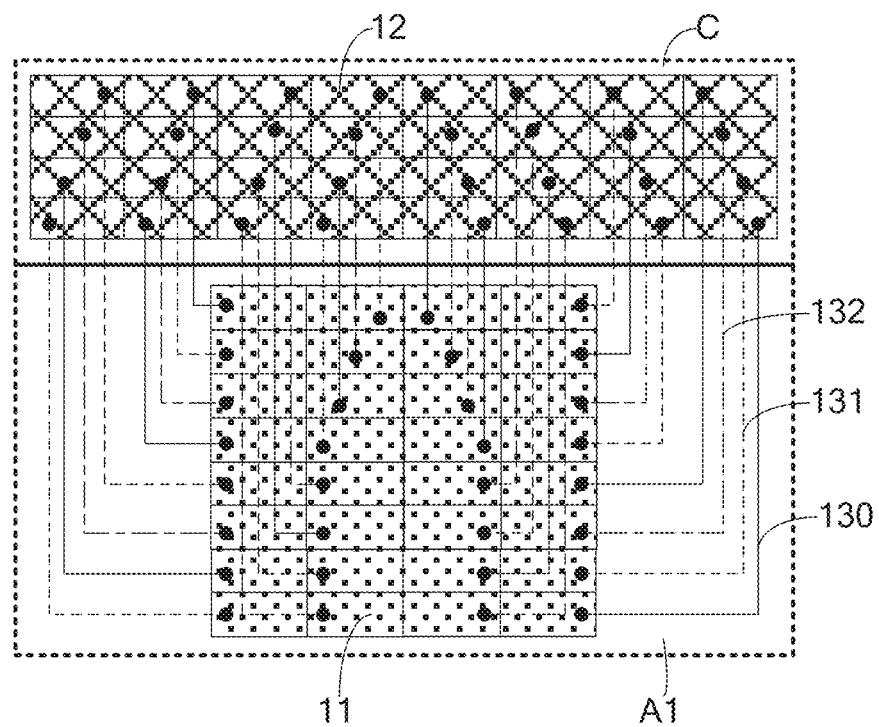
FIG. 4 shows a schematic diagram of a partial structure of a display panel according to yet another embodiment of the present disclosure.
Figure 7:
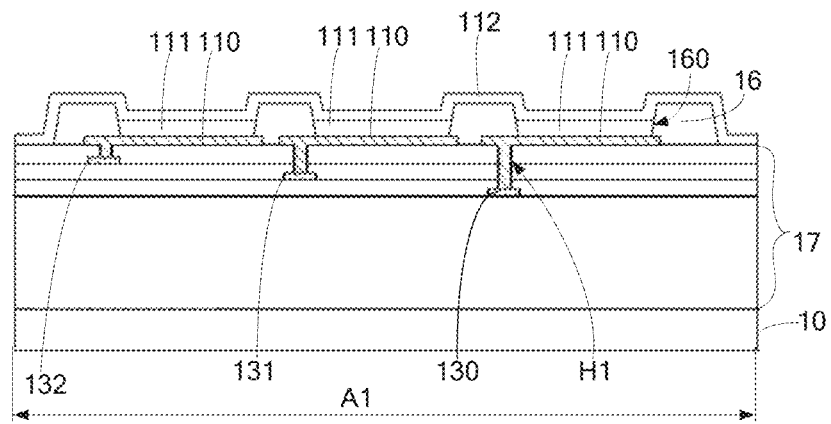
FIG. 7 shows a schematic cross-sectional view of another part of a display panel according to an embodiment of the present disclosure.

The number of stacked layers in the conductive wire 13 can be flexibly adjusted according to the size of the first display sub-area A1. It can be a multilayer or a single layer. For example, according to an embodiment of the present disclosure, the conductive wire 13 may include three layers, namely, the first conductive wire 130, the second conductive wire 131, and the third conductive wire 132 located in different layers. Among the plurality of first light emitting elements 11, some can be electrically connected to the first pixel circuits 12 through the first conductive line 130, some can be electrically connected to the first pixel circuits 12 through the second conductive line 131, and some can be electrically connected to the first pixel circuits through the third conductive line 132, as shown in FIG. 4 and FIG. 7.

Figure 5:
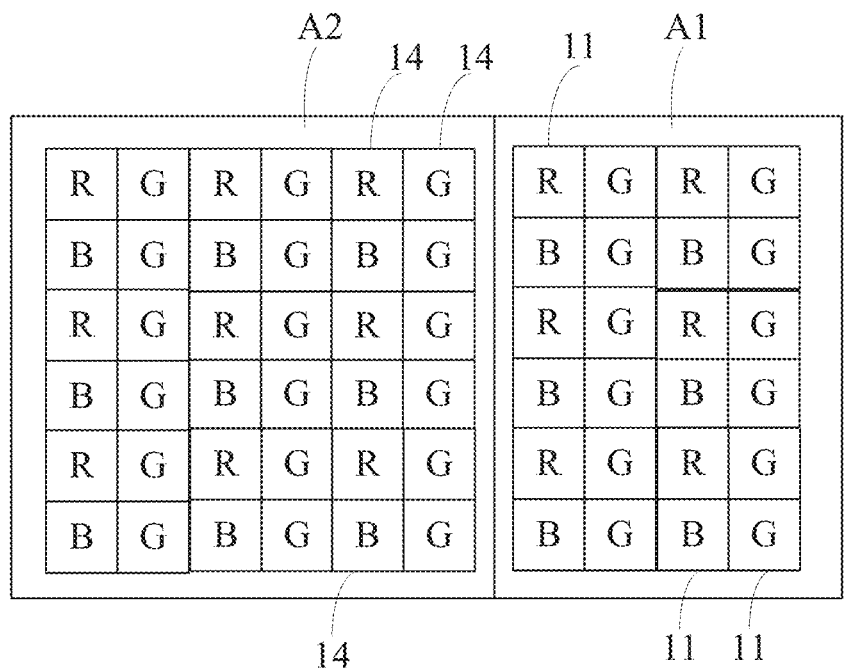
FIG. 5 shows a schematic diagram of a partial structure of a display panel according to still another embodiment of the present disclosure.

In an embodiment of the present disclosure, the plurality of first light emitting elements 11 in the aforementioned first display sub-area A1 have multiple different light emitting colors. As shown in FIG. 5, the plurality of first light emitting elements 11 may include multiple red light emitting elements R, multiple green light emitting elements G, and multiple blue light emitting elements B, wherein the number of the red light emitting elements R is equal to the number of the blue light emitting elements B, and the number of the green light emitting elements G is twice the number of the red light emitting elements R. That is, in the first display sub-area A1, each pixel unit can be composed of one red light emitting element R, one blue light emitting element B, and two green light emitting elements G. In the same way, the plurality of second light emitting elements 14 in the second display sub-area A2 may also have a plurality of different light emitting colors. As shown in FIG. 5, the plurality of second light emitting elements 14 may include a plurality of red light emitting elements R, a plurality of green light emitting elements G, and a plurality of blue light emitting elements B, wherein the number of the red light emitting elements R is equal to the number of the blue light emitting elements B, and the number of the green light emitting elements G is twice the number of the red light emitting elements R. That is to say, in the second display sub-area A2, each pixel unit can be composed of one red light emitting element R, one blue light emitting element B, and two green light emitting elements G.

It should be understood that in the first display sub-area A1 and the second display sub-area A2, each pixel unit may be composed of one red light emitting element R, one blue light emitting element B, and one green light emitting element G. Alternatively, the pixel unit may also include light emitting elements of other colors, depending on the specific circumstances.

Figure 6:
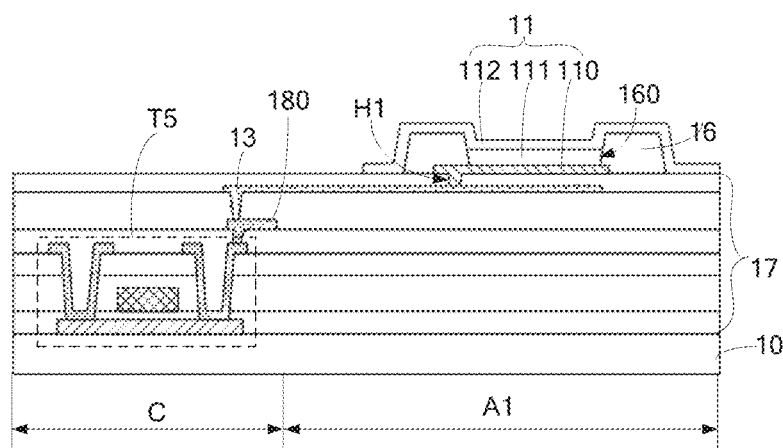
FIG. 6 shows a schematic cross-sectional view of a part of a display panel according to an embodiment of the present disclosure.

In an embodiment of the present disclosure, each first light emitting element 11 may include a first pixel electrode 110, and the first pixel electrode 110 is electrically connected to the first pixel circuit 12 through a conductive wire 13, so as to realize the electrical connection between the first light emitting element 11 and the first pixel circuit 12. For example, as shown in FIG. 6, the conductive wire 13 can be electrically connected with the drain of the transistor (for example, the second light emitting control transistor T5) in the first pixel circuit 12 through the first transfer electrode 180 located in the non-display area C. But the present disclosure is not limited to this. The conductive wire 13 can also be directly electrically connected to the drain of the transistor in the first pixel circuit 12. It should be noted that the first transfer electrode 180 can be made of metal material, which can be the same material as the drain of the transistor.

In addition, as shown in FIG. 6, the first light emitting element 11 may further include a first organic light emitting layer 111 and a first common electrode 112. The first common electrode 112 is located on the side of the first pixel electrode 110 away from the base substrate 10. The first organic light emitting layer 111 is located between the first common electrode 112 and the first pixel electrode 110. For example, the first light emitting element 11 is an Organic Electroluminescent Display (OELD) or organic light emitting semiconductor device.

It should be noted that the aforementioned conductive wire 13 may include three layers, namely, the first conductive wire 130, the second conductive wire 131, and the third conductive wire 132. As shown in FIG. 4, FIG. 6 and FIG. 7, in the first display sub-area A1, part of the first pixel electrodes 110 is electrically connected to the first pixel circuits 12 through the first conductive wire 130, part of the first pixel electrodes 110 is electrically connected to the first pixel circuits 12 through the second conductive wire 131, and part of the first pixel electrodes 110 is electrically connected to the first pixel circuits 12 through the third conductive wire 132.

Figure 8:
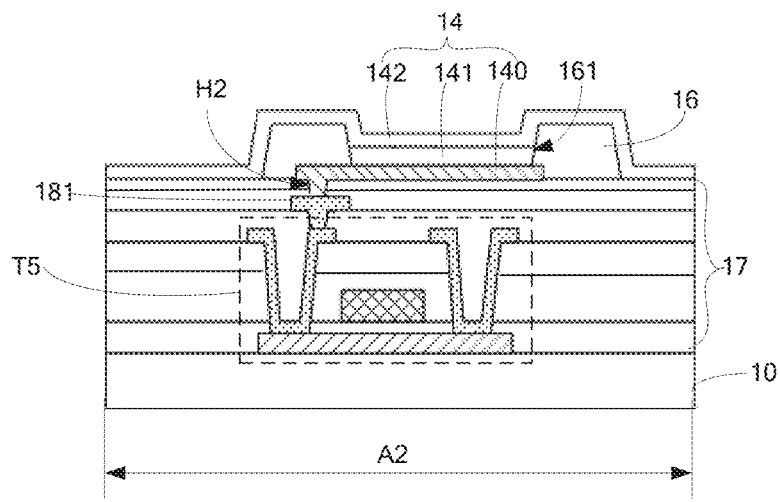
FIG. 8 shows a schematic cross-sectional view of yet another part of a display panel according to an embodiment of the present disclosure.

Each second light emitting element 14 may include a second pixel electrode 140, and the second pixel electrode 140 is electrically connected to the second pixel circuit 15, so as to realize the electrical connection between the second light emitting element 14 and the second pixel circuit 15. For example, as shown in FIG. 3 and FIG. 8, the second pixel electrode 140 can be electrically connected to the drain of the transistor (for example, the second light emitting control transistor T5) in the second pixel circuit 15 through the second transfer electrode 181 located in the second display sub-area A2. But the present disclosure is not limited to this. The second pixel electrode 140 can also be directly electrically connected to the drain of the transistor in the first pixel circuit 12. It should be noted that the second transfer electrode 181 can be made of metal material, which can be the same material as the drain of the transistor.

In addition, as shown in FIG. 8, the second light emitting element 14 may further include a second organic light emitting layer 141 and a second common electrode 142. The second common electrode 142 is located on the side of the second pixel electrode 140 away from the base substrate 10. The second organic light emitting layer 141 is located between the second common electrode 142 and the second pixel electrode 140. For example, the second light emitting element 14 is an OELD device.

It should be understood that the first light emitting element 11 mentioned in embodiments of the present disclosure only includes one first pixel electrode 110, and the second light emitting element 14 only includes one second pixel electrode 140.

It should be noted that the display panel 1 according to an embodiment of the present disclosure may further include an insulating stack 17 located in the first display sub-area A1, the second display sub-area A2, and the non-display region C, as shown in FIGS. 6 to 8. The insulating stack 17 may include multiple inorganic insulating layers (for example, gate insulating layer, interlayer dielectric layer, passivation layer, etc.) and multiple organic insulating layers (for example, multilayer planarization layer). The organic insulating layers may also be only one layer, depending on the specific situations.

The display panel 1 according to an embodiment of the present disclosure may further include a pixel definition layer 16, as shown in FIGS. 6 to 8. The pixel definition layer 16 is formed on the base substrate 10 and is located in the first display sub-area A1 and the second display sub-area A1. The pixel definition layer 16 has a plurality of first pixel openings 160 located in the first display sub-area A1 and a plurality of second pixel openings 161 located in the second display area A. Each first pixel opening 160 is arranged corresponding to a respective first light emitting element 11. That is, the orthographic projection of each first pixel opening 160 on the base substrate 10 is located within the orthographic projection of the first pixel electrode 110 of the respective first light emitting element 11 on the base substrate 10, so as to expose a part of the first pixel electrode 110. Each second pixel opening 161 is arranged corresponding to a respective second light emitting element 14. That is, the orthographic projection of each second pixel opening 161 on the base substrate 10 is located within the orthographic projection on the base substrate 10 of the second pixel electrode 140 of the respective second light emitting element 14, so as to expose a part of the second pixel electrode 140.

It should be noted that the aforementioned first organic light emitting layer 111 can be located in the first pixel opening 160 by inkjet printing (IJP) or evaporation, and the second organic light emitting layer 141 can also be formed in the second pixel opening 161 by inkjet printing or evaporation. It should also be noted that the aforementioned light emitting elements with different light emitting colors refer to different light emitting colors of the organic light emitting layers.

In an embodiment of the present disclosure, as shown in FIG. 7, there are gaps between the first pixel electrodes 110 of adjacent first light emitting elements 11, so as to ensure that each first light emitting element 11 is independently driven by a first pixel circuit 12. But the first common electrode 112 of each first light emitting element 11 is integrally connected to form a whole film layer. Similarly, there are gaps between the second pixel electrodes 140 of adjacent second light emitting elements 14, so as to ensure that each second light emitting element 14 is independently driven by a second pixel circuit 15. But the second common electrode 142 of each second light emitting element 14 is integrally connected to form a whole film layer.

It should be noted that there is also a gap between the first pixel electrode 110 and the second pixel electrode 140, so as to ensure that the first light emitting element 11 and the second light emitting element 14 are driven independently of each other. The first common electrode 112 and the second common electrode 142 may be integrally connected to form an entire common electrode film layer and cover the pixel definition layer 16.

The first pixel electrode 110 and the first common electrode 112 can both have transparent structures. The first pixel electrode 110 and the first common electrode 112 can include ITO or IZO material. But the present disclosure is not limited to this, and they can also include or be other materials. The second pixel electrode 140 and the second common electrode 142 may also be transparent structures. The second pixel electrode 140 and the second common electrode 142 may include ITO or IZO material. But the present disclosure is not limited thereto, and they may also include or be other materials.

Figure 9:
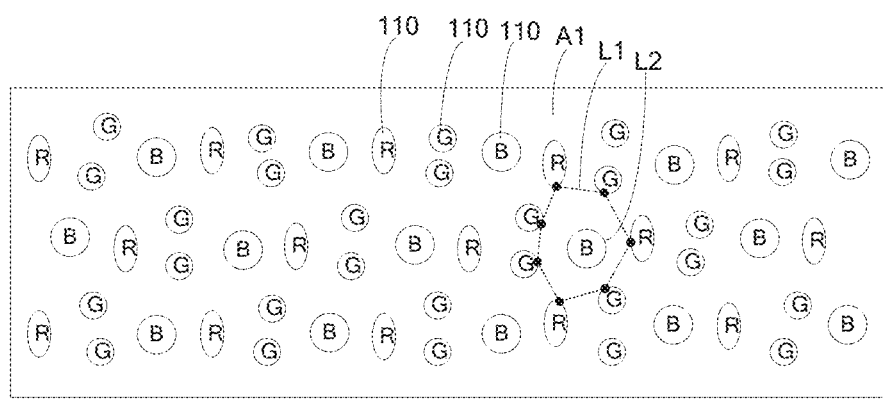
FIG. 9 shows a schematic arrangement diagram of the first pixel electrodes in the first light emitting elements in the first display sub-area of the display panel according to an embodiment of the present disclosure.

In an embodiment of the present disclosure, as shown in FIG. 9, the gaps around the first pixel electrodes 110 in at least two first light emitting elements 11 with the same light emitting color in the first display sub-area A1 have different patterns. In some embodiments, the gaps around the first pixel electrodes 110 all have different patterns. That is, the gaps around the first pixel electrodes 110 of the first light emitting elements 11 with the same light emitting color are all different, and the gaps around the first pixel electrodes 110 of the first light emitting elements 11 with different light emitting colors also have different patterns. In this design, the first pixel electrodes 110 in the first display sub-area A1 are configured in an irregular design or arrangement, so that the diffraction directions of light passing through each first pixel electrode 110 and the gap around it are different, and the light diffraction in different directions are superposed over each other for cancelling, which can reduce the diffraction interference. When the photosensitive sensor such as the camera is placed in the second display sub-area A2, the image quality can be improved.

It should be noted that in the present disclosure, any pixel electrode (the first pixel electrode 110) is used as the target electrode, and the pixel electrodes adjacent to and around the target electrode are called auxiliary electrodes. Among the auxiliary electrodes, the point closest to the center of the target electrode is called the target point. As shown in FIG. 9, the contour line formed by successively connecting the target points of each auxiliary electrode is the target contour line L1, and the pattern enclosed by the target contour line L1 and the outer contour line L2 of the target electrode is the gap pattern. It should also be noted that the two pixel electrodes being adjacent to each other means that there are no other pixel electrodes in the area between the two pixel electrodes.

Figure 19:
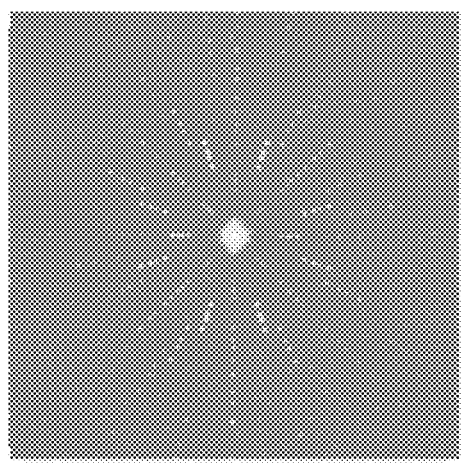
FIG. 19 shows a simulation result diagram of a point light source diffraction effect with a regular arrangement of the first pixel electrodes in the first display sub-area according to the related art.
Figure 20:
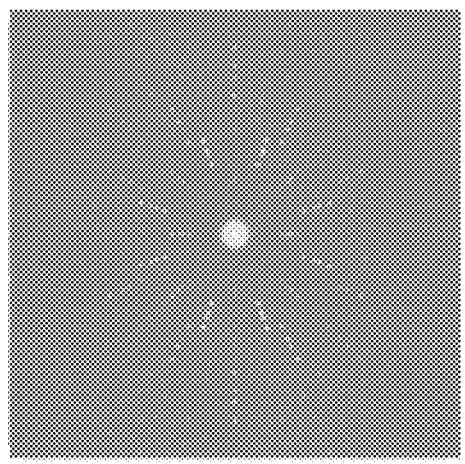
FIG. 20 shows a simulation result diagram of a point light source diffraction effect with irregular arrangement of the first pixel electrodes in the first display sub-area according to an embodiment of the present disclosure.

FIG. 19 shows a simulation result diagram of the point light source diffraction effect with a regular arrangement of the first pixel electrodes in the first display sub-area A1 according to the related art. It should be noted that the regular arrangement of the first pixel electrodes in the first display sub-area A1 as mentioned here means that the gaps around the first pixel electrodes 110 in the first light emitting elements 11 with the same light emitting color in the first display sub-area A1 have the same patterns. In this case, the diffraction formed by the first pixel electrode 110 with the same pattern of gaps around it is superposed over each other, and the diffraction interference is greatly enhanced. FIG. 20 shows a simulation result diagram of a point light source diffraction effect with an irregular arrangement of the first pixel electrodes in the first display sub-area A1 according to an embodiment of the present disclosure. Comparing the simulation results of FIG. 19 and FIG. 20, the results show that, as different from the regular arrangement of the first pixel electrodes in the first display sub-area A1, the irregular arrangement of the first pixel electrodes in the first display sub-area A1 presents a disappeared fine diffraction, which improving the diffraction interference.

Figure 21:
FIG. 21 is a diagram showing the diffraction encircled energy obtained based on FIG. 19 and FIG. 20.

FIG. 21 is a diagram showing the diffraction encircled energy obtained based on FIG. 19 and FIG. 20. The horizontal axis represents the distance from the point light source, and the vertical axis represents the concentration of diffraction energy within a certain radius from the point light source as the origin. The higher the concentration, the weaker the diffraction interference. The dotted line in FIG. 21 represents the diffraction encircled energy with the regular arrangement of the first pixel electrodes 110 in the first display sub-area A1. The solid line in FIG. 21 represents the diffraction encircled energy with the irregular arrangement of the first pixel electrodes 110 in the first display sub-area A1. FIG. 21 also shows that the irregular arrangement of the first pixel electrode 110 has an effect of improving diffraction interference.

Figure 10:
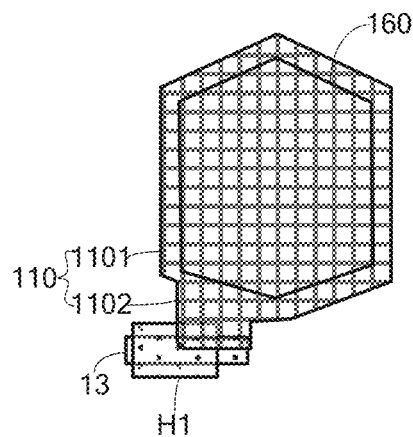
FIG. 10 shows a schematic diagram of the positional relationship between the first pixel electrode and the first pixel opening, the first via structure and the conductive wire according to another embodiment of the present disclosure.

For example, as shown in FIG. 10, in an embodiment of the present disclosure, the first pixel electrode 110 may include a first main electrode portion 1101 and a first connection portion 1102 arranged in the same layer and connected to each other. That is, the first main electrode portion 1101 and the first connection portion 1102 may be integrally processed. It should be noted that in an embodiment of the present disclosure, the first pixel electrode 110 may only include one first main electrode portion 1101 and one first connection portion 1102.

As shown in FIG. 10, the orthographic projection on the base substrate 10 of each of the aforementioned first pixel openings 160 can be located within the orthographic projection on the base substrate 10 of the first main electrode portion 1101 of the respective first pixel electrode 110. Optionally, the gap between the contour line of the first main electrode portion 1101 of each first pixel electrode 110 and the contour line of the corresponding first pixel opening 160 may be from 1 μm to 5 μm, for example being 1 μm, 2 μm, 3 μm, 4 μm, 5 μm, and so on.

In addition, the center of the orthographic projection on the base substrate 10 of each first main electrode portion 1101 coincides with the center of the orthographic projection on the base substrate 10 of the corresponding first pixel opening 160. But the present disclosure is not limited to this, and the above two centers may not coincide with each other, according to the actual situations.

The first connection portion 1102 of at least part of the first pixel electrodes 110 can be electrically connected to the conductive line 13 through the first via structure H1 located in the first display sub-area A1, as shown in FIG. 10. It should be noted that the orthographic projection of the first via structure H1 on the base substrate 10 does not coincide with the orthographic projection of the first main electrode portion 1101 on the base substrate 10, so as to avoid the influence of the first via structure H1 on the light emitting effect.

For example, the first connection portion 1102 of each first pixel electrode 110 is electrically connected to the conductive wire 13 through a respective first via structure H1. But the present disclosure not limited to this. If the first pixel electrode 110 is adjacent to the first pixel circuit 12 electrically connected thereto, and is provided on the same layer with the conductive wire 13 electrically connected thereto, the electrical connection may not be achieved through the first via structure H1, depending on the specific situations. It should be noted that the conductive wire 13 may be located on the side of the first pixel electrode 110 close to the array substrate 10.

Figure 11:
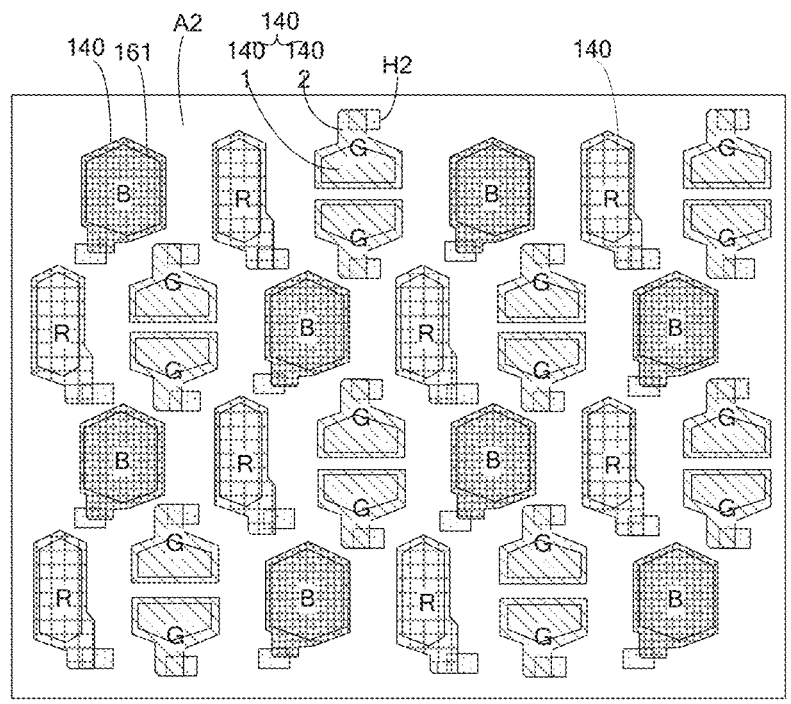
FIG. 11 shows a schematic diagram of the positional relationship between the first pixel electrode and the second pixel opening and the second via structure in each of the second light emitting elements in the second display sub-area of the display panel according to an embodiment of the present disclosure.

In an embodiment of the present disclosure, the gaps around the second pixel electrode 140s of at least part of the second light emitting elements 14 have the same patterns. For example, as shown in FIG. 11, the gaps around the second pixel electrodes 140 in the second light emitting elements 14 with the same light emitting color may have the same pattern, and the gaps around the second pixel electrodes 140 in the second light emitting elements 14 with different light emitting colors may have different patterns. That is, the second pixel electrodes 140 in the second display sub-area A2 may be designed or arranged regularly. In this way, while ensuring the display effect, the design difficulty can also be reduced.

In order to realize that the gaps around the second pixel electrodes 140 in the second light emitting elements 14 with the same light emitting color have the same pattern, and that the gaps around the second pixel electrodes 140 in the second light emitting elements 14 with different light emitting colors have different patterns, according to an embodiment of the present disclosure, the patterns of the second pixel electrodes 140 of the second light emitting elements 14 with the same light emitting color are the same, the distributions of other second light emitting elements 14 around the second light emitting elements 14 with the same light emitting color (including the type and number of light emitting elements, and the pitch) are the same, and the patterns of the second pixel electrodes 140 of the second light emitting elements 14 with different light emitting colors are different.

It should be noted that the second pixel electrode 140 in the second display sub-area A2 according to an embodiment of the present disclosure is not limited to the regular design or arrangement mentioned above, and may also be irregularly designed or arranged. That is, the gaps around the second pixel electrodes 140 in the second light emitting element 14, whether having the same light emitting color or different light emitting colors, have all different patterns depending on the specific situation. In addition, the gaps around the second pixel electrodes 140 in the second light emitting elements 14, whether having the same light emitting color or different light emitting colors, may also have the same pattern.

For example, as shown in FIG. 11, the second pixel electrode 140 according to an embodiment of the present disclosure may include a second main electrode portion 1401 and a second connection portion 1402 arranged in the same layer and connected to each other. Namely, the second main electrode portion 1401 and the second connection portion 1402 may be integrally processed. It should be noted that the second pixel electrode 140 according to an embodiment of the present disclosure may only include one second main electrode portion 1401 and one second connection portion 1402.

As shown in FIG. 11, the orthographic projection on the base substrate 10 of each of the aforementioned second pixel openings 161 may be located within the orthographic projection on the base substrate 10 of the second main electrode portion 1401 of a respective second pixel electrode 140. The gap between the contour line of the second main electrode portion 1401 of the second pixel electrode 140 and the contour line of the second pixel opening 161 corresponding thereto is from 1 μm to 5 μm, for example being 1 μm, 2 μm, 3 μm, 4 μm, 5 μm, etc.

Optionally, as shown in FIG. 11, the shape of the second main electrode portion 1401 of each second pixel electrode 140 is the same as the shape of the second pixel opening 161 corresponding thereto. In addition, the center of the orthographic projection on the base substrate 10 of the second main electrode portion 1401 of each second pixel electrode 140 coincides with the center of the orthographic projection on the base substrate 10 of the second pixel opening 161 corresponding thereto.

As shown in FIG. 1, the second connection portion 1402 of each second pixel electrode 140 can be electrically connected to the second pixel circuit 15 through the second via structure H2 located in the second display sub-area A2. It should be noted that the second pixel circuit 15 may be located on the side of the second pixel electrode 140 close to the array substrate 10. In addition, the orthographic projection on the base substrate 10 of the second via structure H2 does not coincide with the orthographic projection on the base substrate 10 of the second main electrode portion 1401, so as to avoid the influence of the second via structure H2 on the light emitting effect. Optionally, the gap between the second main electrode portion 1401 of the second pixel electrode 140 in the second light emitting element 14 and the second via structure H2 connected thereto is a second gap, and the value of the second gap can be from 0 to 10 μm, such as being 0, 2 μm, 4 μm, 6 μm, 8 μm, 10 μm and so on.

It should be noted that the patterns of the second pixel electrodes 140 in the second light emitting elements 14 with the same light emitting color are the same. That is, in the second light emitting elements 14 with the same light emitting color, for the second pixel electrodes 140, the second main electrode portions 1401 have the same shape and area, the second connection portions 1402 have the same shape and area, and the relative positions between the second main electrode portions 1401 and the second connection portions 1402 are all the same.

In the present disclosure, unless otherwise specified, the term "in the same layer" used means that two layers, components, members, elements, or parts can be formed by the same patterning process, and the two layers, components, members, elements, or parts are generally formed of the same material.

In the present disclosure, unless otherwise specified, the expression "patterning process" generally includes the steps of photoresist coating, exposure, development, etching, and photoresist stripping. The expression "one-time patterning process" means a process of forming patterned layers, parts, components, etc., using a single mask.

In order to realize the irregular design or arrangement of the first pixel electrodes 110 in the first display sub-area A1, embodiments of the present disclosure can be implemented by adjusting the patterns of the first pixel electrodes 110. Based on the aforementioned first pixel electrode 110 including the first main electrode portion 1101 and the first connecting portion 1102, and in order to realize the irregular design or arrangement of the first pixel electrodes 110 in the first display sub-area A1 by adjusting the pattern of each first pixel electrode 110, in an embodiment of the present disclosure, the patterns of the first main electrode portions 1101 of the first pixel electrodes 110 are set different, so that each first pixel electrode 110 is irregularly designed or arranged. Alternatively, the patterns of the first connection portions 1102 of the first pixel electrodes 110 are set different, so that the first pixel electrodes 110 are irregularly designed or arranged. Alternatively, the patterns of the first connection portions 1102 of the first pixel electrodes 110 are all set different, and the patterns of the first main electrode portions 1101 of the first pixel electrodes 110 are all set different, so that the first pixel electrodes 110 are irregularly designed or arranged.

It should be noted that the parameters involved in the patterns mentioned according to embodiments of the present disclosure may specifically include two aspects, namely, area and shape. That is, in order to make the patterns of the first main electrode portions 1101 of the first pixel electrodes 110 different, the areas and/or shapes of the first main electrode portions 1101 can be adjusted. Similarly, in order to make the patterns of the first connection portions 1102 of the first pixel electrodes 110 to be all different, the areas and/or shapes of the first connection portions 1102 can be adjusted.

Specifically, by adjusting the pattern of each first pixel electrode 110, the scheme of achieving irregular design or arrangement of each first pixel electrode 110 can be as follows.

Implementation One

The patterns of the first main electrode portions 1101 of the first pixel electrodes 110 are all different. Alternatively, the area of the first main electrode portion 1101 of each first pixel electrode 110 is different. That is, the areas of the first main electrode portions 1101 of the first pixel electrodes 110 in the first light emitting elements 11 having the same light emitting color are all different, and the areas of the first main electrode portions 1101 of the first pixel electrodes 110 in the first light emitting elements 11 having different light emitting colors are also different.

Figure 12:
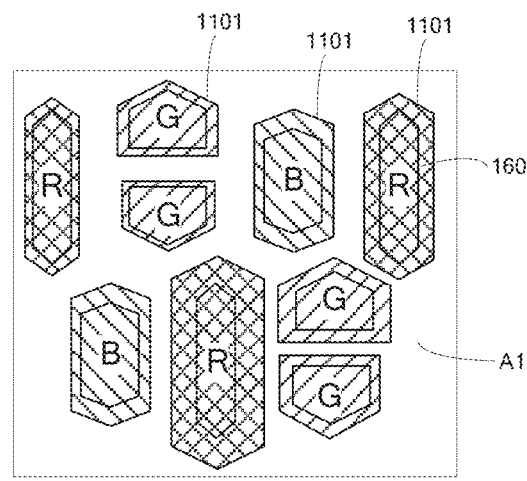
FIG. 12 shows a schematic arrangement diagram of the first main electrode portion of the first pixel electrode in each of the first light emitting elements in the first display sub-area of the display panel according to a first embodiment of the present disclosure.

In an embodiment, the first main electrode portions 1101 of the first pixel electrodes 110 in the first light emitting elements 11 with the same light emitting color may have the same shape; and the first main electrode portions 1101 of the first pixel electrodes 110 in the first light emitting elements 11 with different light emitting colors may have the same shape or different shapes. For example, as shown in FIG. 12, the shape of the first main electrode portion 1101 of the first pixel electrode 110 in the red light emitting element R may be a hexagon, the shape of the first main electrode portion 1101 of the first pixel electrode 110 in the blue light emitting element B can also be a hexagon, and the shape of the first main electrode portion 1101 of the first pixel electrode 110 in the green light emitting element G can be a pentagon. But the present disclosure is not limited to this. Alternatively, the shape of the first main electrode portion 1101 of the first pixel electrode 110 in the red light emitting element R may be an ellipse, the shape of the first main electrode portion 1101 of the first pixel electrode 110 in the blue light emitting element B may be circle, and the shape of the first main electrode portion 1101 of the first pixel electrode 110 in the green light emitting element G may also be a circle or the like.

That is, under the condition that the areas and sizes of the first main electrode portions 1101 of the first pixel electrodes 110 are all different, the shapes of the first main electrode portions 1101 of the first pixel electrodes 110 may be the same or different. This helps to ensure that the first pixel electrodes 110 are irregularly designed or arranged.

Optionally, in an embodiment, as shown in FIG. 12, the shape of the first main electrode portion 1101 of the first pixel electrode 110 is the same as the shape of the first pixel opening 160 corresponding thereto. In the first light emitting element 11 and the second light emitting element 14 with the same light emitting color, the shape of the first main electrode portion 1101 of the first pixel electrode 110 in the first light emitting element 11 is the same as that of the second main electrode portion 1401 of the second pixel electrode 140 in the second light emitting element 14. Further, the ratio of the area of the first main electrode portion 1101 of the first pixel electrode 110 in the first light emitting element 11 to the area of the second main electrode 1401 of the second pixel electrode 140 in the second light emitting element is from 0.9 to 1.1, such as being 0.9, 0.95, 1.0, 1.05, 1.1, etc. This design helps to ensure that there is a relatively small difference among the light emitting effects of the light emitting elements having the same light emitting color in the first display sub-area A1 and the second display sub-area A2 present, so that the display effect of the entire display area A can be ensured.

For example, in conjunction with FIG. 11 and FIG. 12, it can be seen that the shape of the first main electrode portion 1101 of the first pixel electrode 110 in the red light emitting element R located in the first display sub-area A1 is a hexagon, and its area is the first area. The shape of the second main electrode portion 1401 of the second pixel electrode 140 in the red light emitting element R located in the second display sub-area A2 is also a hexagon, and its area is the second area. The ratio of the first area to the second area is from 0.9 to 1.1. The shape of the first main electrode portion 1101 of the first pixel electrode 110 in the blue light emitting element B located in the first display sub-area A1 is a hexagon, and its area is the third area. The shape of the second main electrode portion 1401 of the second pixel electrode 140 in the blue light emitting element B located in the second display sub-area A2 is also a hexagon, and its area is the fourth area. The ratio of the third area to the fourth area is from 0.9 to 1.1. The shape of the first main electrode portion 1101 of the first pixel electrode 110 in the green light emitting element G located in the first display sub-area A1 is a pentagon, and its area is the fifth area. The shape of the second main electrode portion 1401 of the second pixel electrode 140 in the green light emitting element G located in the second display sub-area A2 is also a pentagon, and its area is the sixth area. The ratio of the fifth area to the sixth area is from 0.9 to 1.1.

That is, when having the same light emitting color, the area of the first main electrode portion 1101 of the first pixel electrode 110 in the first light emitting element 11 can be expanded, reduced, or remain unchanged with relative to the area of the second main electrode portion 1401 of the second pixel electrode 140 in the second light emitting element.

In order to make the first main electrode portions 1101 of the first pixel electrodes 110 in the first light emitting elements 11 with the same light emitting color have different areas, as compared with the area of the second main electrode portion 1401 of the first pixel electrode 140 in the second light emitting element 14 with the same color, the area of the first main electrode portion 1101 of the first pixel electrode 110 in each first light emitting element 11 can be enlarged or reduced according to different proportions, or partially enlarged according to different proportions while partially reduced according to different proportions.

In addition, it should be understood that, in order to make the first main electrode portions 1101 of the first pixel electrodes 110 in the first light emitting elements 11 with the same light emitting color have different areas, there may be one only first light emitting element 11 in the first display sub-area A1, the area of the first main electrode portion 1101 of the first pixel electrode 110 in which is the same as the area of the second main electrode portion 1401 of the first pixel electrode 140 in the second light emitting element 14 in the second display sub-area A2, while other first light emitting element 11 in the first display sub-area A1 are enlarged or reduced according to different proportions.

It should be noted that the different ratios in the aforementioned expansion or reduction according to different proportions should all be within the aforementioned range from 0.9 to 1.1.

Implementation Two

The main difference from the Implementation One is that the shape of the first main electrode portion 1101 of the first pixel electrode 110 is different from the shape of the first pixel opening 160 corresponding thereto, and other conditions can be the same as or different from the Implementation One, as long as it can be ensured that the patterns of the first main electrode portions 1101 of the first pixel electrodes 110 are not the same, so that the first pixel electrodes 110 are irregularly designed or arranged.

Optionally, in an embodiment, the shape of the first pixel opening 160 is a polygon, and the shape of the first pixel electrode 110 is an ellipse or a circle.

Figure 13:
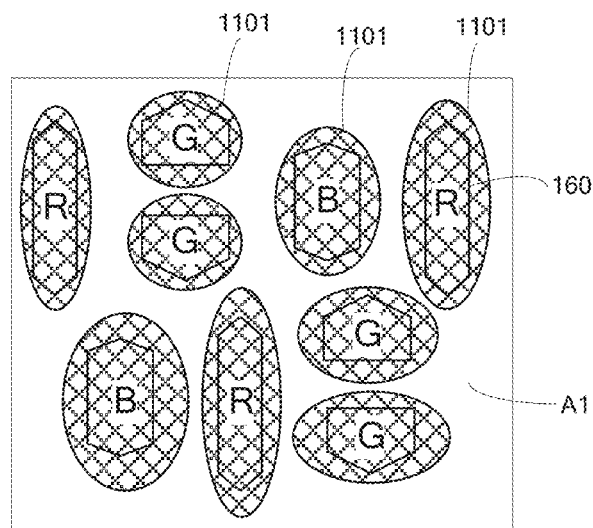
FIG. 13 shows a schematic arrangement diagram of the first main electrode portion of the first pixel electrode in each of the first light emitting elements in the first display sub-area of the display panel according to a second embodiment of the present disclosure.

For example, as shown in FIG. 13, in the first display sub-area A1, the shape of the first pixel opening 160 corresponding to the red light emitting element R may be a hexagon, and the shape of the first main electrode portion 1101 of the first pixel electrode 110 in the red light emitting element R may be an ellipse. The shape of the first pixel opening 160 corresponding to the blue light emitting element B may be a hexagon, and the shape of the first main electrode portion 1101 of the first pixel electrode 110 in the blue light emitting element B may be an ellipse. The shape of the first pixel opening 160 corresponding to the green light emitting element G may be a pentagon, and the shape of the first main electrode portion 1101 of the first pixel electrode 110 in the green light emitting element G may be ellipse. The long axes of the elliptical first pixel electrodes 110 are different, and the short axes of the elliptical first pixel electrodes 110 are also different.

It should be noted that the shape of the first pixel electrode 110 is not limited to the above-mentioned ellipse and circle, and can also be other shapes, as long as it can be ensured that the first pixel electrodes 110 are irregularly designed or arranged.

Implementation Three

The main difference from the Implementation Three is that the patterns of the first main electrode portions 1101 of the first pixel electrodes 110 in the first light emitting elements 11 with the same light emitting color are the same. That is, the shapes are the same and the areas are also the same. The patterns of the first pixel electrodes 110 are implemented in an embodiment by making the length directions of the first connection portions 1102 of the first pixel electrodes 110 different in at least part of the first light emitting elements 11 having the same light emitting color. That is, by changing the positional relationship between the first connection portion 1102 and the first main electrode portion 1101 in the first pixel electrode 110, the overall shape of the first pixel electrode 110 can be changed, so that the patterns of the first pixel electrodes 110 are different. Thus, the scheme in which the first pixel electrodes 110 are irregularly designed or arranged can be achieved. It should be noted that the remaining conditions can be the same as or different from the Implementation One, as long as it can be ensured that the patterns of the first pixel electrodes 110 are not the same, so that the first pixel electrodes 110 are irregularly designed or arranged.

Figure 14:
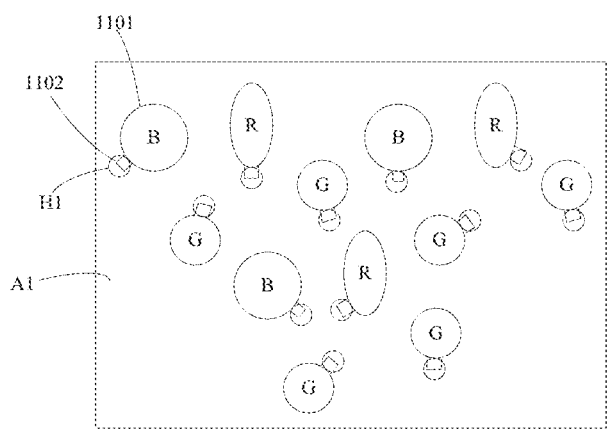
FIG. 14 shows a schematic arrangement diagram of the first pixel electrode in each of the first light emitting elements in the first display sub-area of the display panel according to a third embodiment of the present disclosure.

In an embodiment, optionally, as shown in FIG. 14, the length directions of the first connection portions 1102 of the first pixel electrodes 110 in the first light emitting elements 11 with the same light emitting color are all different; and the length directions of the first connection portions 1102 of the first pixel electrodes 110 in the first light emitting elements 11 having different light emitting colors may be the same or different, as long as it can be ensured that the first pixel electrodes 110 are irregularly designed or arranged.

In an embodiment, optionally, the patterns (that is, the shapes and the areas) of the first connection portions 1102 of the first pixel electrodes 110 in the first light emitting elements 11 with the same light emitting color are the same; while the patterns (i.e., the shapes and the areas) of the first connection portions 1102 of the first pixel electrodes 110 in the light emitting elements 11 with the same light emitting color may be the same or different, as long as it can be ensured that the first pixel electrodes 110 are irregularly designed or arranged.

Implementation Four

The main difference from the Implementation Three is that the patterns (i.e., the shapes and the areas) of the first connection portions 1102 of the first pixel electrodes 110 in at least part of the first light emitting elements 11 with the same light emitting color are different. It should be noted that the remaining conditions may be the same as or different from the Implementation Three, as long as it can be ensured that the patterns of the first pixel electrodes 110 are different, so that the first pixel electrodes 110 are irregularly designed or arranged.

In an embodiment, optionally, the length directions of the first connection portions 1102 of at least two of the first light emitting elements 11 with the same light emitting color are different. It should be noted that the length of the first connection portion 1102 in the present disclosure is mainly related to the gap between the first main electrode portion 1101 connected thereto and the first via structure, wherein the gap between the first main electrode portion 1110 of the first pixel electrode 110 in the first light emitting element 11 and the first via structure H1 connected thereto through the first connection portion 1102 is the first gap. Therefore, in order to make the lengths of the first connection portions 1102 of the first pixel electrodes 110 in at least part of the first light emitting elements 11 with the same light emitting color to be different, the first gaps of at least two of the first light emitting elements with the same light emitting color can be different.

Figure 15:
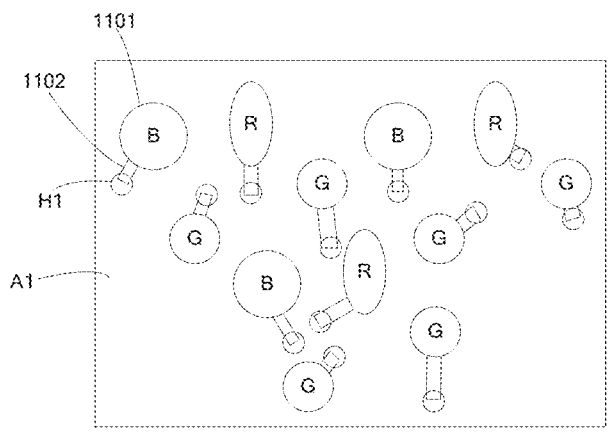
FIG. 15 shows a schematic arrangement diagram of the first pixel electrode in each of the first light emitting elements in the first display sub-area of the display panel according to a fourth embodiment of the present disclosure.

In an embodiment, optionally, as shown in FIG. 15, the first gaps of at least two of the first light emitting elements 11 with the same light emitting color may be different; while the first gaps of the first light emitting elements 11 with different light emitting colors may be the same or different, as long as it can be ensured that the patterns of the first pixel electrodes 110 are different, so that the first pixel electrodes 110 are irregularly designed or arranged.

In an embodiment, optionally, the value of the first gap can be from 0 to 10 jam, such as 0, 2 µm, 4 µm, 6 µm, 8 µm, 10 µm, etc. With this design, it is ensured that while the first gaps in the first light emitting elements 11 with the same light emitting color are all different, the light emitting effects of the first light emitting elements 11 are not much different to guarantee the display effect. In addition, the design space at the first display sub-area A1 can also be saved. This facilitates the design of other structures in the first display sub-area A1.

It should be noted that, in order to realize the irregular design or arrangement of the first pixel electrodes 110 in the first display sub-area A1, an embodiment of the present disclosure can be implemented not only by adjusting the patterns of the first pixel electrodes 110, but also by moving the position of each first pixel electrode 110, such as moving up and down, moving left and right, and rotating at different angles, under the premise of not changing the pattern of the first pixel electrode 110.

Specifically, the scheme by moving the position of each first pixel electrode 110 to realize the irregular design or arrangement of the first pixel electrodes 110 is as follows.
Implementation Five Compared with the foregoing Implementation One, Implementation Two, Implementation Three, and Implementation Four, the main difference according to Implementation Five is that, the premise is keeping the pattern of the first pixel electrode 110 not changed. In other words, the premise is that the first pixel electrodes 110 of the first light emitting elements 11 having the same light emitting color have the same pattern, and the patterns of the first pixel electrodes 110 in the light emitting elements 11 having the same light emitting color are the same as the pattern of the second pixel electrode 140 in the second light emitting element 14. In this case, the positions of the first pixel electrodes 110 are changed by moving the first pixel electrodes 110 horizontally (for example, moving up and down in the column direction, moving left and right in the row direction), so that the first pixel electrodes 110 in the first display sub-area A1 are irregular designed or arranged. It should be noted that other conditions can be the same as or different from Implementation One, Implementation Two, Implementation Three, and Implementation Four, as long as it can be ensured that the first pixel electrodes 110 are irregularly designed or arranged.

Figure 16:
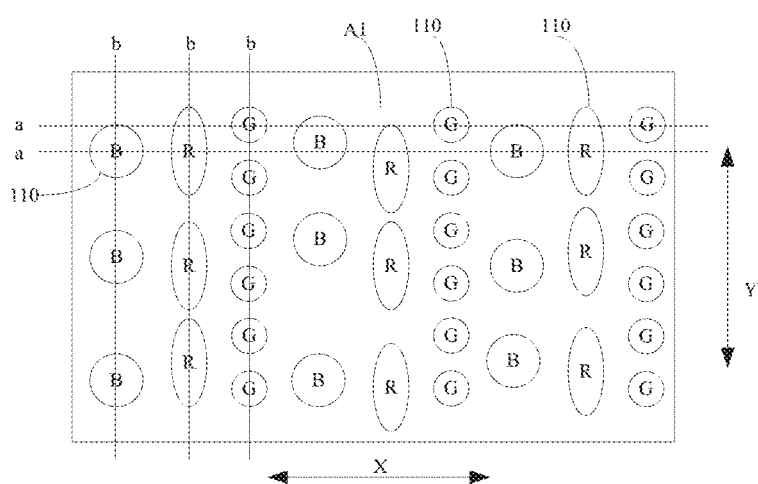
FIG. 16 shows a schematic arrangement diagram of the first pixel electrode in each of the first light emitting elements in the first display sub-area of the display panel according to a fifth embodiment of the present disclosure.

In an embodiment, optionally, as shown in FIG. 16, in each row, the center of the first pixel electrode 110 of at least one of the first light emitting elements 11 with the same emitting color is not located on the first straight line. The first straight line a is parallel to the row direction X. In each column, the gaps in the column direction Y between the first pixel electrodes 110 of any two of the first light emitting elements 11 with the same light emitting color are different.

For example, in each row, the center of the first pixel electrode 110 of at least one of the plurality of red light emitting elements R is not located on the first straight line a, the center of the first pixel electrode 110 of at least one of the plurality of blue light emitting elements B is not located on the first straight line a, and the centers of the first pixel electrodes 110 of the plurality of green light emitting elements G are all located on the first straight line a. In each column, the gaps in the column direction Y between the first pixel electrodes 110 of any two of the plurality of red light emitting elements R are different, the gaps in the column direction Y between the first pixel electrodes of any two of the plurality of blue light emitting elements B are different, and the gaps in the column direction Y between the first pixel electrodes of two adjacent ones of the plurality of green light emitting elements G are different.

Further, in each row, the gaps in the row direction X between the first pixel electrodes 110 of two adjacent ones of the plurality of red light emitting elements R are the same; and in each column, the centers of the first pixel electrodes of the plurality of red light emitting elements R are located on the second straight line. In each row, the gaps in the row direction X between the first pixel electrodes of two adjacent ones of the plurality of blue light emitting elements B are the same; and in each column, the centers of the first pixel electrodes of the plurality of blue light emitting elements B are all located on the second straight line. In each row, the gaps in the row direction X between the first pixel electrodes 110 of two adjacent ones of the plurality of green light emitting elements G are the same; and in each column, the centers of the first pixel electrodes 110 of the plurality of green light emitting elements G are all located on the second straight line, wherein the second straight line is parallel to the column direction Y.

It should be noted that the light emitting elements in an embodiment are not limited to the above-mentioned arrangement form, but may also be in other forms, as long as the positions of the first pixel electrodes 110 are changed by horizontal movement, so as to realize an irregular design or arrangement of the first pixel electrodes 110 in the first display sub-area A1.
Implementation Six The main difference from the Implementation Five is that the premise according to Implementation Six is to keep the pattern of the first pixel electrode 110 not changed. In other words, the premise is that the first pixel electrodes 110 in the first light emitting elements 11 with the same light emitting color have the same pattern, and the patterns of the first pixel electrodes 110 in the first light emitting elements 11 with the same light emitting color are the same as the pattern of the second pixel electrode 140 in the second light emitting element 14. In this case, the positions of the first pixel electrodes 110 are changed by rotating the first pixel electrodes 110, so as to achieve an irregular design or arrangement of the first pixel electrodes 110 in the first display sub-area A1. It should be noted that other conditions can be the same as or different from Implementation Five, as long as it can be guaranteed that the first pixel electrodes 110 are irregularly designed or arranged.

In an embodiment, optionally, in the first display sub-area A1, the first pixel electrode 110 of one of the first light emitting elements 11 with the same light emitting color is set as the reference electrode, and the first pixel electrodes 110 of the remaining light emitting elements 11 rotate a certain angle relative to the reference electrode, wherein the rotation angle is from −10° to +10°. It should be noted that the first light emitting element 11 with the same light emitting color of for example Red, Green, or Blue can be defined as a reference electrode, and then the first light emitting element 11 with the other colors can be relatively rotated.

However, it should be understood that the rotation mode according to an embodiment is not limited to the aforementioned way, and other modes may also be used, as long as it can be ensured that the first pixel electrodes 110 are irregularly designed or arranged.

In addition, in order to realize the irregular design or arrangement of the first pixel electrodes 110 in the first display sub-area A1, embodiments of the present disclosure may also adjust the patterns of the first pixel electrodes 110 and adjust the positions of the first pixel electrodes 110.

Figure 17:
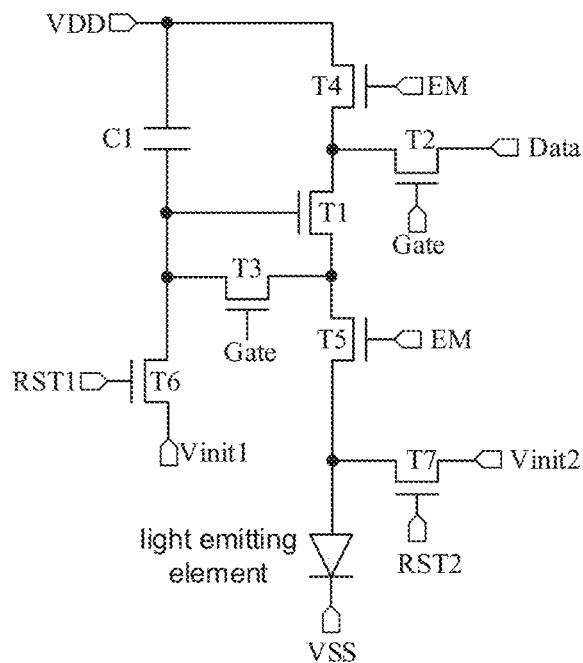
FIG. 17 shows an equivalent circuit diagram of a 7T1C pixel circuit.

In an embodiment of the present disclosure, the aforementioned pixel circuit (i.e., the first pixel circuit and the second pixel circuit) may have a 7T1C structure. That is, it may include 7 transistors and 1 capacitor. FIG. 17 shows a schematic structural diagram of a 7T1C pixel circuit, and FIG. 18 shows a structural layout of a 7T1C pixel circuit.

Figure 18:
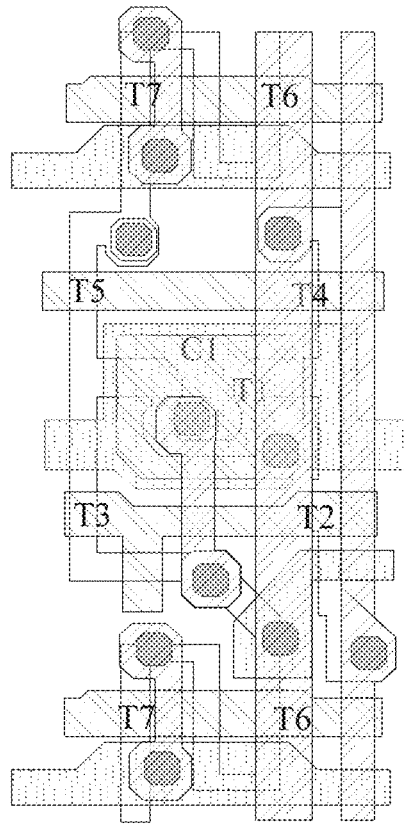
FIG. 18 shows a structural layout of a 7T1C pixel circuit.

In conjunction with the pixel circuit shown in FIG. 17 and FIG. 18, the 7T1C pixel circuit includes a driving transistor T1, a data writing transistor T2, a threshold compensation transistor T3, a first light emitting control transistor T4, a second light emitting control transistor T5, a first reset transistor T6, a second reset transistor T7, and a storage capacitor C1. The pixel circuit can be connected to the gate signal terminal Gate, the data signal terminal Data, the reset signal terminals RST1 and RST2, the light emission control signal terminal EM, the power supply terminal VDD, the initial power supply terminals Vinit1 and Vinit2, and the light emitting element (i.e., the first pixel electrode 110 of the first light emitting element 11 or the second pixel electrode 140 of the second light emitting element 14). The light emitting element (i.e., the first common electrode 112 of the first light emitting element 11 or the second common electrode 142 of the second light emitting element 14) can also be connected to the power supply terminal VS S. The pixel circuit can be used to drive the connected light emitting elements to emit light in response to the signal provided by each connected signal terminal.

In addition, transistors can be divided into N-type and P-type transistors according to their characteristics. In embodiments of the present disclosure, the transistors all adopting P-type transistors are used as an example for description. Based on the description and teaching of implementations in the present disclosure, those of ordinary skill in the art can easily think of using N-type transistors to replace at least part of the transistors in the pixel circuit structure according to embodiments of the present disclosure without creative work. That is, the N-type transistors, or a combination of the N-type transistor and the P-type transistor, can be used as well. Therefore, these implementations are also within the protection scope of embodiments of the present disclosure.

Figure 22:
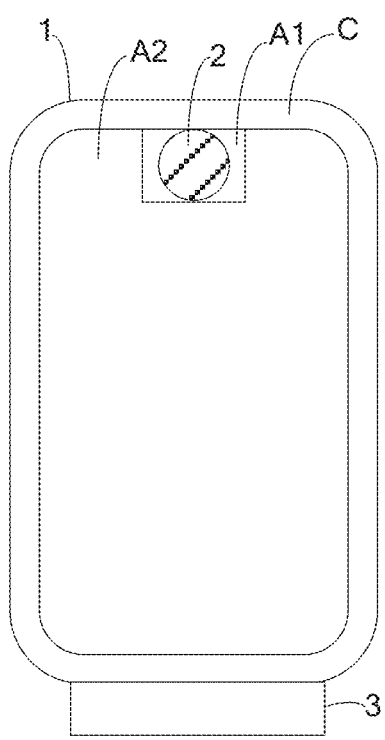
FIG. 22 shows a schematic structural diagram of a display device according to an embodiment of the present disclosure.

An embodiment of the present disclosure also provides a display device, as shown in FIG. 22, which may include the display panel 1 described in any of the foregoing embodiments, and may also include a photosensitive sensor 2 provided on the backlight side of the display panel 1. The orthographic projection of the photosensitive sensor 2 on the base substrate 10 is located in the first display sub-area A1.

For example, the photosensitive sensor can be a camera, and the camera is arranged on the backlight side of the display panel 1 and corresponding to the first display sub-area A1. Since the light transmittance of the first display sub-area A1 corresponding to the camera is improved, a good shooting effect of the camera can be ensured. Therefore, the display device according to the present disclosure presents both a good display effect and an under-screen shooting effect.

In an embodiment of the present disclosure, as shown in FIG. 22, the display device may further include an integrated circuit 3. The integrated circuit 3 may be connected to the first pixel circuit 12 and the second pixel circuit 15 in the display panel 1, and used to drive the first pixel circuit 12 and the second pixel circuit 15 to work. For example, the integrated circuit 3 can be connected to each signal terminal connected to the pixel circuit and used to provide signals for each signal terminal.

It should be noted that the integrated circuit 3 can also be located on the right side of the display panel 1, or can be located on both the left side and the right side of the display panel 1. Alternatively, it may also be located on the upper side and/or lower side of the display panel 1.

Optionally, the display device may be any product or component with a display function, such as an OLED display, a mobile phone, a tablet computer, a flexible display device, a television, and a display.

It should be noted that in addition to the display panel 1, the photosensitive sensor 2, and the integrated circuit 3, the display device also includes other necessary components and parts. Taking the display as an example, these components and parts may be specifically such as a housing, a battery, etc. Corresponding supplements can be made by those skilled in the art according to the specific use requirements of the display device, which will not be repeated here.

Although relative terms such as "up", "down", "left", "right", "inner" and "outer" are used in the specification to describe the relative relationship between one component represented by an icon and another, these terms are used in the specification only for convenience. For example, the relative relationship may be disclosed according to the example directions described in the drawings. It can be understood that if the device represented by the icon is turned over and turned upside down, the component described as "upper" will become a "lower" component. When a structure is "on" the other structure, it may mean that a certain structure is integrally formed on the other structure, or that a certain structure is "directly" installed on the other structure, or that a certain structure is "indirectly" installed on the other structure through a third structure.

The terms "a", "an", "the", "said" and "at least part" are used to indicate the presence of one or more elements/components/etc. The terms "including" and "have" are used to indicate open-ended inclusion and means that there may be additional elements/components/etc. in addition to the listed elements/components/etc.

In the present disclosure, the terms "first" and "second" are only used for descriptive purposes, and cannot be understood as indicating or implying relative importance.

Those skilled in the art will easily think of other embodiments of the present disclosure after considering the specification and practicing the present invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are defined by the appended claims.

The invention claimed is:

1. A display panel, comprising:
a base substrate having a display area and a non-display area surrounding the display area, the display area comprising a first display sub-area and a second display sub-area;
a plurality of first light emitting elements formed on the base substrate and located in the first display sub-area, wherein each of the first light emitting elements comprises a first pixel electrode, a gap exists between adjacent first pixel electrodes, and the gaps around the first pixel electrodes in at least two of the first light emitting elements with the same light emitting color have different patterns; and
a plurality of first pixel circuits, formed on the base substrate and located in at least one of the second display sub-area and the non-display area, wherein the first pixel circuits are electrically connected to the first pixel electrodes via a conductive wire, wherein:
the first pixel electrode comprises a first main electrode portion and a first connection portion that are located in the same layer and connected to each other, and at least a part of the first connection portion is electrically connected to the conductive wire through a first via structure located in the first display sub-area; and
a respective gap between the first main electrode portion and the first via structure connected thereto through the first connection portion is a first gap, and the first gaps in at least two of the first light emitting elements with the same light emitting color are different, wherein the first gap has a value from 0 to 10 μm.

2. The display panel of claim 1, further comprising:
a plurality of second light emitting elements, formed on the base substrate and located in the second display sub-area, wherein each of the second light emitting elements comprises a second pixel electrode, a gap exists between adjacent second pixel electrodes, and the gaps around at least a part of the second pixel electrodes have the same pattern; and
a plurality of second pixel circuits, formed on the base substrate and located in the second display sub-area, wherein the second pixel circuits are electrically connected to the second pixel electrodes, an orthographic projection on the base substrate of the second pixel circuits at least partially overlaps with an orthographic projection on the base substrate of the second light emitting elements electrically connected thereto.

3. The display panel of claim 2, wherein:
the display panel further comprises a pixel definition layer, formed on the base substrate and located in the first display sub-area and the second display sub-area, wherein the pixel definition layer has a plurality of first pixel openings located in the first display sub-area and a plurality of second pixel openings located in the second display sub-area;
the second pixel electrode comprises a second main electrode portion and a second connection portion that are located in the same layer and connected to each other, wherein the second connection portion is electrically connected to the second pixel circuits through a second via structure located in the second display sub-area; and
an orthographic projection on the base substrate of each of the first pixel openings is located within an orthographic projection on the base substrate of a respective first main electrode portion, and an orthographic projection on the base substrate of each of the second pixel openings is located within an orthographic projection on the base substrate of a respective second main electrode portion.

4. The display panel of claim 3, wherein the gaps around the first pixel electrodes have different patterns.

5. The display panel of claim 4, wherein the first main electrode portions have different patterns.

6. The display panel of claim 5, wherein the first main electrode portions have different areas.

7. The display panel of claim 6, wherein
a shape of the first main electrode portion in each of the first light emitting elements is the same as a shape of the first pixel opening corresponding thereto;
a shape of the second main electrode portion in each of the second light emitting elements is the same as a shape of the second pixel opening corresponding thereto, and the second main electrode portions of the second pixel electrodes in the second light emitting elements with the same light emitting color have the same pattern; and
a part of the first light emitting elements and a part of the second light emitting elements have the same light emitting color, wherein, in the first light emitting element and the second light emitting element having the same light emitting color, a shape of the first main electrode portion of the first light emitting element and a shape of the second main electrode portion of the second light emitting element are the same, and a ratio of an area of the first main electrode portion of the first light emitting element to an area of the second main electrode portion of the second light emitting element is from 0.9 to 1.1.

8. The display panel of claim 6, wherein a shape of the first main electrode portion is different from a shape of the first pixel opening corresponding thereto.

9. The display panel of claim 3, wherein the first connection portions of at least two of the first light emitting elements with the same light emitting color have different length directions.

10. The display panel of claim 3, wherein
a center of an orthographic projection on the base substrate of each of the first main electrode portions coincides with a center of an orthographic projection on the base substrate of the first pixel opening corresponding thereto; and
a center of an orthographic projection on the base substrate of each of the second main electrode portions coincides with a center of an orthographic projection on the base substrate of the second pixel opening corresponding thereto.

11. The display panel of claim 10, wherein a gap between a contour line of each of the first main electrode portions and a contour line of the first pixel opening corresponding thereto is from 1 μm to 5 μm, and a gap between a contour line of each of the second main electrode portions and a contour line of the second pixel opening corresponding thereto is from 1 μm to 5 μm.

12. The display panel of claim 3, wherein:
in each row, a center of the first pixel electrode of at least one of the first light emitting elements with the same light emitting color is not located on a first straight line, the first straight line being parallel to the row direction; and
in each column, gaps in the column direction between the first pixel electrodes of any two of the first light emitting elements with the same light emitting color are different.

13. The display panel of claim 12, wherein
the plurality of first light emitting elements comprises a plurality of red light emitting elements, a plurality of blue light emitting elements, and a plurality of green light emitting elements, the number of the red light emitting elements being equal to the number of the blue light emitting elements, and the number of the green light emitting elements being twice the number of the red light emitting elements;
in each row, a center of the first pixel electrode of at least one of the plurality of red light emitting elements is not located on the first straight line, a center of the first pixel electrode of at least one of the plurality of blue light emitting elements is not located on the first straight line, and centers of the first pixel electrodes of the plurality of green light emitting elements are all located on the first straight line; and
in each column, gaps in the column direction between the first pixel electrodes of any two of the plurality of red light emitting elements are different, gaps in the column direction between the first pixel electrodes of any two of the plurality of blue light emitting elements are different, and gaps in the column direction between the first pixel electrodes of two adjacent ones of the plurality of green light emitting elements are the same.

14. The display panel of claim 13, wherein:
in each row, gaps in the row direction between the first pixel electrodes of two adjacent ones of the plurality of red light emitting elements are the same, and in each column, centers of the first pixel electrodes of the plurality of red light emitting elements are all located on a second straight line;
in each row, gaps in the row direction between the first pixel electrodes of two adjacent ones of the plurality of blue light emitting elements are the same, and in each column, centers of the first pixel electrodes of the plurality of blue light emitting elements are all located on the second straight line;
in each row, gaps in the row direction between the first pixel electrodes of two adjacent ones of the plurality of green light emitting elements are the same, and in each column, centers of the first pixel electrodes of the plurality of green light emitting elements are all located on the second straight line; and
the second straight line is parallel to the column direction.

15. The display panel of claim 2, wherein
each of the first pixel circuits is electrically connected to the first pixel electrode of a respective one of the first light emitting elements through a conductive wire; and
each of the second pixel circuits is electrically connected to the first pixel electrode of a respective one of the second light emitting elements.

16. The display panel of claim 1, wherein the conductive wire is located on a side of the first pixel electrode close to the base substrate.

17. The display panel of claim 1, wherein materials of the first pixel electrode and the conductive wire comprise indium zinc oxide or indium tin oxide.

18. A display device, comprising:
a display panel, comprising:
a base substrate having a display area and a non-display area surrounding the display area, the display area comprising a first display sub-area and a second display sub-area;
a plurality of first light emitting elements formed on the base substrate and located in the first display sub-area, wherein each of the first light emitting elements comprises a first pixel electrode, a gap exists between adjacent first pixel electrodes, and the gaps around the first pixel electrodes in at least two of the first light emitting elements with the same light emitting color have different patterns;
a plurality of first pixel circuits formed on the base substrate and located in at least one of the second display sub-area and the non-display area, wherein the first pixel circuits are electrically connected to the first pixel electrodes via a conductive wire; and
a photosensitive sensor provided on a backlight side of the display panel, wherein an orthographic projection on the base substrate of the photosensitive sensor is located within the first display sub-area, wherein:
the first pixel electrode comprises a first main electrode portion and a first connection portion that are located in the same layer and connected to each other, and at least a part of the first connection portion is electrically connected to the conductive wire through a first via structure located in the first display sub-area; and
a respective gap between the first main electrode portion and the first via structure connected thereto through the first connection portion is a first gap, and the first gaps in at least two of the first light emitting elements with the same light emitting color are different, wherein the first gap has a value from 0 to 10 μm.

* * * * *